United States Patent
Aklik et al.

(10) Patent No.: US 11,086,717 B2
(45) Date of Patent: Aug. 10, 2021

(54) RANDOM SELECTION OF CODE WORDS FOR READ VOLTAGE CALIBRATION

(71) Applicant: Seagate Technology LLC, Cupertino, CA (US)

(72) Inventors: Mehmet Emin Aklik, Edina, MN (US); Antoine Khoueir, Apple Valley, MN (US); Ara Patapoutian, Hopkinton, MA (US); Colin Hill, Colorado Springs, CO (US); Kurt Walter Getreuer, Colorado Springs, CO (US); Darshana H. Mehta, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 15 days.

(21) Appl. No.: 16/670,329

(22) Filed: Oct. 31, 2019

(65) Prior Publication Data

US 2021/0133025 A1    May 6, 2021

(51) Int. Cl.

| | | |
|---|---|---|
| *G06F 11/10* | (2006.01) | |
| *G11C 16/04* | (2006.01) | |
| *G11C 16/26* | (2006.01) | |
| *H03M 13/11* | (2006.01) | |
| *G11C 11/56* | (2006.01) | |
| *G11C 16/10* | (2006.01) | |
| *G11C 16/34* | (2006.01) | |

(52) U.S. Cl.
CPC ...... *G06F 11/1068* (2013.01); *G11C 11/5628* (2013.01); *G11C 11/5642* (2013.01); *G11C 16/0483* (2013.01); *G11C 16/10* (2013.01); *G11C 16/26* (2013.01); *G11C 16/3459* (2013.01); *H03M 13/1102* (2013.01)

(58) Field of Classification Search
CPC ............. G06F 11/1068; G11C 11/5628; G11C 11/5642; G11C 16/10; G11C 16/0483; G11C 16/3459; G11C 16/26; H03M 13/1102

See application file for complete search history.

(56) References Cited

U.S. PATENT DOCUMENTS

| | | |
|---|---|---|
| 7,190,284 B1 | 3/2007 | Dye et al. |
| 8,040,725 B2 | 10/2011 | Kang |
| 8,213,255 B2 | 7/2012 | Hemlink et al. |
| 8,427,875 B2 | 4/2013 | Yang |
| 8,861,272 B1 | 10/2014 | Horn |

(Continued)

*Primary Examiner* — Thien Nguyen
(74) *Attorney, Agent, or Firm* — Hall Estill Law Firm (57) ABSTRACT

Method and apparatus for managing data in a non-volatile memory (NVM) of a storage device, such as a solid-state drive (SSD). In some embodiments, flash memory cells are arranged along word lines to which read voltages are applied to sense programmed states of the memory cells, with the flash memory cells along each word line being configured to concurrently store multiple pages of data. An encoder circuit is configured to apply error correction encoding to input data to form code words having user data bits and code bits, where an integral number of the code words are written to each page. A reference voltage calibration circuit is configured to randomly select a single selected code word from each page and to use the code bits from the single selected code word to generate a set of calibrated read voltages for the associated page.

20 Claims, 7 Drawing Sheets

(56) References Cited

U.S. PATENT DOCUMENTS

| | | |
|---|---|---|
| 9,076,545 B2 | 7/2015 | Mokhlesi |
| 9,286,933 B2 | 3/2016 | Mathew et al. |
| 9,659,664 B1 | 5/2017 | Griffin et al. |
| 10,216,572 B2 | 2/2019 | Lu |
| 10,263,640 B2 | 4/2019 | Djurdjevic et al. |
| 2012/0230132 A1* | 9/2012 | Soma .................... G11C 16/20 365/189.15 |
| 2016/0247577 A1* | 8/2016 | Lee ....................... G11C 16/10 |
| 2017/0148510 A1* | 5/2017 | Bazarsky ............... G11C 16/26 |
| 2019/0066802 A1* | 2/2019 | Malshe ............. G11C 16/0483 |

* cited by examiner

READ/PROGRAM VERIFY (PV) CIRCUIT

FIG. 6

PROGRAMMING CIRCUIT

RANDOM SELECTION OF CODE WORDS FOR READ VOLTAGE CALIBRATION

SUMMARY

Various embodiments of the present disclosure are generally directed to a method and apparatus for managing a non-volatile memory (NVM), such as but not limited to a three-dimensional (3D) NAND flash memory device.

In some embodiments, flash memory cells are arranged along word lines to which read voltages are applied to sense programmed states of the memory cells, with the flash memory cells along each word line being configured to concurrently store multiple pages of data. An encoder circuit is configured to apply error correction encoding to input data to form code words having user data bits and code bits, where an integral number of the code words are written to each page. A reference voltage calibration circuit is configured to randomly select a single selected code word from each page and to use the code bits from the single selected code word to generate a set of calibrated read voltages for the associated page.

These and other features and advantages which characterize the various embodiments of the present disclosure can be understood in view of the following detailed discussion and the accompanying drawings.

DETAILED DESCRIPTION

The present disclosure generally relates to systems and methods for managing data stored in a memory (NVM).

Many current generation data storage devices such as solid state drives (SSDs) utilize NAND flash memory to provide non-volatile storage of data from a host device. Flash memory generally operates to store data in the form of accumulated electrical charge on a floating gate of each memory cell in the flash array. The programmed state can be sensed through the application of one or more read sense voltages to the cell.

These and other forms of erasable memories generally operate by being programmed to store data during a program (write) operation. Once programmed, the data may be read from the associated memory cells during subsequent read operations. The memory cells require an erasure operation to reset the memory cells before the cells can store replacement data. Each program/erase cycle is sometimes referred to as a PE cycle or PE count. A flash memory has a limited total number of PE counts that can be experienced during the operational life of the memory before the memory is worn out and no longer usable.

SSDs are often arranged to have a controller and a flash module. The controller provides front end processing of data and may include one or more programmable processors that execute programming instructions (firmware, FW) during operation. The flash module includes a flash memory electronics (FMC) front end and a number of semiconductor flash memory dies grouped together via channels. Each die can include a number of planes, with each plane capable of concurrently carrying out a data access operation.

From a physical standpoint, each plane has an array of erasure blocks with memory cells connected to word lines, with each erasure block representing the smallest unit of memory that can be erased at a time. From a logical/virtual standpoint, each plane can be configured to form multiple garbage collection units (GCUs) which are allocated and erased as a unit. Each GCU may be formed from an erasure block from each plane/die combination across a number of dies (such as 32 dies, etc.). Pages are blocks of data stored to the cells along each word line. Multiple pages of data can be concurrently stored to the same word line.

Reference voltage levels are supplied by the controller to the flash module to facilitate the reading of data. Input digital values are applied to a DAC to generate a suitable word line voltage on the associated memory cells to sense the programmed bits of a particular page.

It is generally desirable to periodically perform a reference voltage calibration process to update the reference voltage levels for each group of cells in the memory. There are a number of environmental and operational factors that can cause the memory to require new, updated reference voltage levels, such as PE counts, data aging, temperature (ambient or cross-temperature), read disturb, etc. A reference voltage calibration operation may involve reading a set of data multiple times using different read voltage levels and evaluating error rate performance associated with each level. A final set of read voltages is selected that provides optimum performance for the associated portion of memory.

Once an updated set of read voltage levels is obtained, the levels are stored in memory and supplied by the controller to the memory as required during a read recovery operation. In some cases, the read voltage levels may be a baseline set of levels that can further be adjusted as required.

A limitation associated with existing read voltage calibration operations relates to the length of time required to perform and complete the calibration process. It is generally time consuming to go through and evaluate every page in a flash memory and derive a separate set of read voltage levels. These calibration operations are carried out in the background while the SSD is servicing existing host and garbage collection related read and write commands. Taking too much time to perform such calibration operations can adversely degrade host I/O data transfer performance.

One existing way in which current SSD products perform read voltage calibration operations is to select a representative sample of pages for evaluation. These can be those pages that historically have shown the worst performance in the system. In some cases, the worst performing X % of the pages may be selected for evaluation from among the various dies, planes and pages in the drive. The localized read voltage levels are then applied to remaining nearby memory locations. In one example, about 10% of the pages in the flash are selected and evaluated. While operable, this approach can cause problems particularly in 3D NAND where the cells on each WL can require different read voltage levels. Various embodiments of the present disclosure address these and other limitations of the existing art by randomly selecting a small portion of data from every page in the system and subjecting this data to read voltage level calibration operation. In some cases, the amount of data will be a code word (CW), which represents a selected amount of user data (e.g., 4 KB) plus an associated number of error correction code (ECC) bits. The ECC bits may take the form of low density parity check (LDPC) bits, but this is not necessarily required as any number of different forms of ECC bits can be used as desired.

In cases where there are 8 CWs written to each page, selecting a single CW from each page in the system provides a sampling rate of approximately 12% of the total data storage capacity. This process provides a set of updated read voltage levels for every page in the system (e.g., a different set for each page type on each WL). This process takes roughly the same total time as sampling the entirety of 10% of the pages, and obtains coverage across all pages in the system.

In some embodiments, the CW for evaluation in each page is randomly selected, such as through the use of a random number generator (e.g., entropy source plus extraction and CW selection circuits, etc.). In this way, depth is provided across each page as well as to each page. Multiple random numbers may be used so that different memory cells are evaluated for each of the page types along a given word line (e.g., for a selected WL X, CW location 2 is used for SLC reference voltages, CW location 7 is used for MLC reference voltages, CW location 1 is used for TLC reference voltages and CW location 4 is used for QLC reference voltages). In other embodiments, an incrementing mechanism is used to select different code words for each WL and page types therein.

The read voltage levels selected by the technique can be used during normal reads or supplied during read recovery operations after initial default read values have been tried and have failed. In some cases, adjustments to the read voltage levels can be made based on temperature (including cross-temperature effects, which relate to differences between programming temperature and reading temperature), PE counts, data aging, read counts, etc. The final read voltage levels can be further augmented by the system when supplied by the controller to the flash memory, such as during a read recovery operation.

The random selection of code words ensures that different sets of the memory cells along each word line are evaluated, and can be cross-correlated as necessary. For example, if QLCs are being used and 8 code words are provided in each page, then 50% of the memory cells in each word line will be subjected to testing during the separate evaluation of four different code words (e.g., each of the four code words will be stored in a different $\frac{1}{8}^{th}$ of the cells along that word line). Cross correlation can occur if, for example, one of the code words has difficulties resolving; the system can examine the reference voltages for other code sets to determine if further adjustments should be made, etc.

Figure 1:
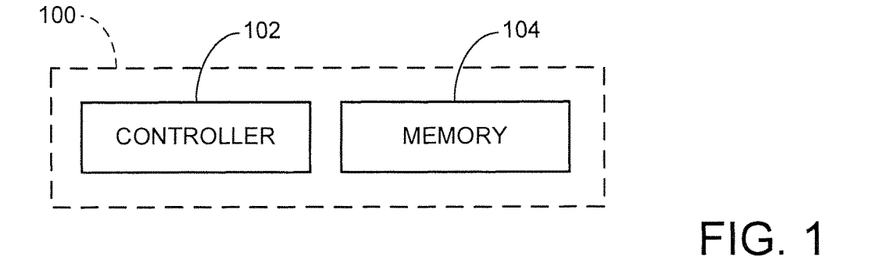
FIG. 1 provides a functional block representation of a data storage device constructed and operated in accordance with various embodiments of the present disclosure.

These and other features and advantages of various embodiments can be understood beginning with a review of FIG. 1 which provides a functional block diagram of an exemplary data storage device 100. The device 100 is characterized as a solid-state drive (SSD) that employs non-volatile semiconductor memory such as 3D NAND flash memory, although the present disclosure is not so limited.

The device 100 includes a controller circuit 102 which provides top-level control and communication functions as the device interacts with a host device (not shown) to store and retrieve host user data. A memory module 104 provides non-volatile storage of the data in the form of an array of flash memory cells.

The controller 102 may be a programmable CPU processor that operates in conjunction with programming stored in a computer memory within the device. The controller may alternatively be a hardware controller. The controller may be a separate circuit or the controller functionality may be incorporated directly into the memory array 104.

As used herein, the term controller and the like will be broadly understood as an integrated circuit (IC) device or a group of interconnected IC devices that utilize a number of fundamental circuit elements such as but not limited to transistors, diodes, capacitors, resistors, inductors, waveguides, circuit paths, planes, printed circuit boards, memory elements, etc. to provide a functional circuit regardless whether the circuit is programmable or not. The controller may be arranged as a system on chip (SOC) IC device, a programmable processor, a state machine, a hardware circuit, a portion of a read channel in a memory module, etc.

Figure 2:
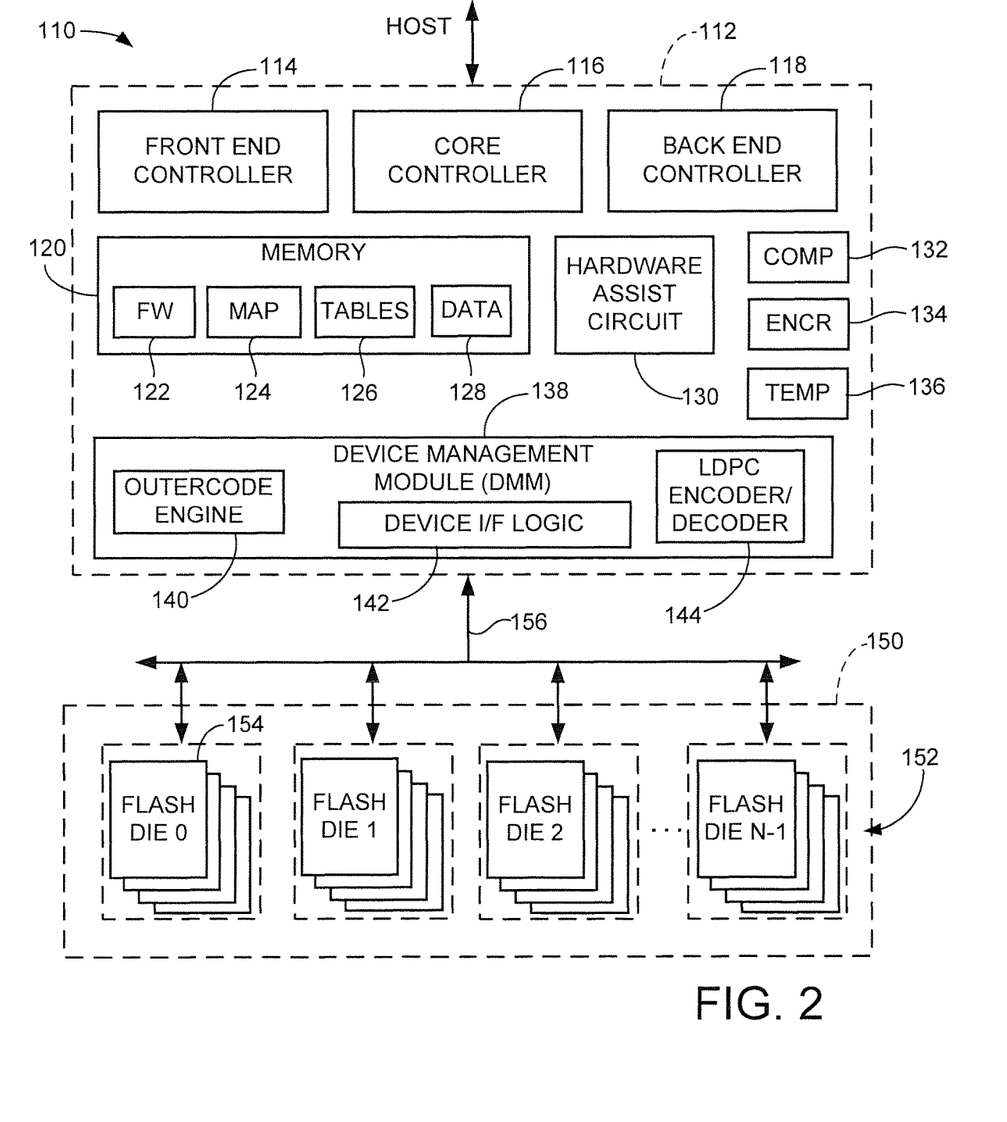
FIG. 2 illustrates the data storage device of FIG. 1 characterized as a solid-state drive (SSD) that uses NAND flash memory in accordance with some embodiments.

In order to provide a detailed explanation of various embodiments, FIG. 2 describes relevant aspects of an exemplary data storage device 110 corresponding to the device 100 of FIG. 1. The device 110 is shown in FIG. 2 to be configured as a solid state drive (SSD) that communicates with one or more host devices via one or more Peripheral. Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) specification, which enables different users to allocate NVM sets (die sets) for use in the storage of data. Each die set may form a portion of an NVMe namespace that may span multiple SSDs or be contained within a single SSD. Each NVMe namespace will be owned and controlled by a different user (owner). While aspects of various embodiments are particularly applicable to devices operated in accordance with the NVMe Standard, such is not necessarily required.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including loaded firmware (FW) 122, map data 124, table data 126 and user data 128 in read/write buffers temporarily cached during host data transfers.

A non-processor based hardware assist circuit 130 may enable the offloading of certain memory management tasks by one or more of the controllers as required. The hardware circuit 130 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in or adjacent the controller 112, such as a data compression block 132, an encryption block 134 and a temperature sensor block 136. These elements can be realized using hardware/firmware as required. The data compression block 132 applies lossless data compression to input data sets during write operations to enhance storage efficiency. It is contemplated albeit not required that all of the user data supplied for storage by the SSD 110 will be compressed prior to storage to the flash memory.

The encryption block 134 applies suitable compression and other cryptographic processing to provide data security for the SSD. The temperature block 136 may include one or more temperature sensors that monitor and record temperatures of the SSD during operation.

A device management module (DMM) 138 supports back end processing operations and may include an outer code engine circuit 140 to generate outer code, a device I/F logic circuit 142 and a low density parity check (LDPC) circuit 144 configured to generate and use LDPC codes as part of an error detection and correction strategy to protect the data stored by the SSD 110.

A memory module 150 corresponds to the memory 104 in FIG. 1 and includes a non-volatile memory (NVM) in the form of a flash memory 152 distributed across a plural number N of flash memory dies 154. Flash memory control electronics (not separately shown in FIG. 2) may be provisioned to facilitate parallel data transfer operations via a number of channels (lanes) 156.

Figure 3:
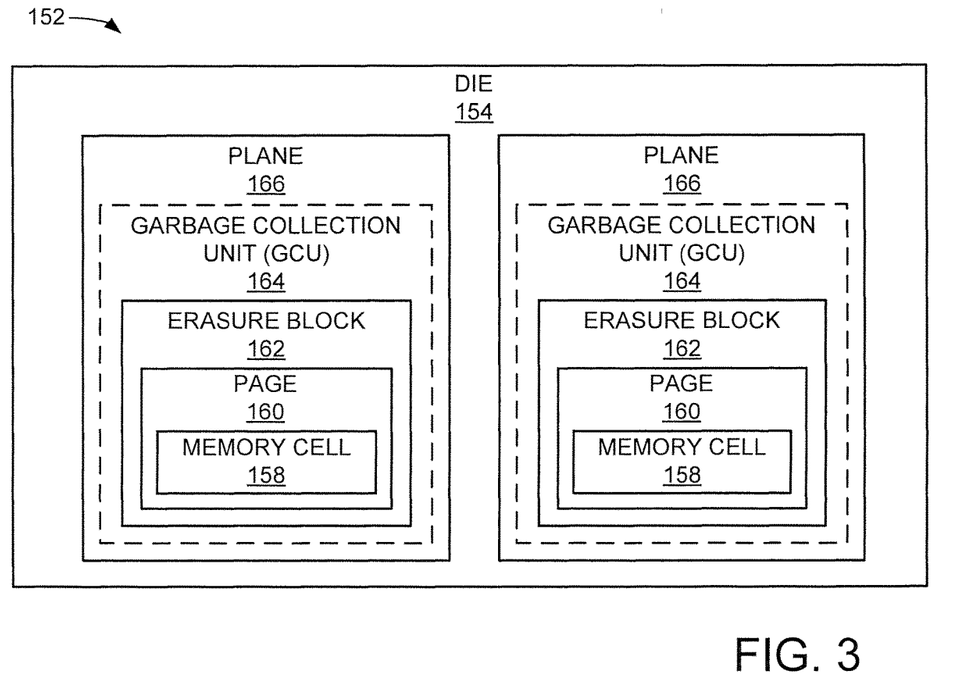
FIG. 3 is a physical and functional layout of the flash memory of FIG. 2 in some embodiments.

FIG. 3 shows a physical/logical arrangement of the various flash memory dies 154 in the flash memory 152 of FIG. 2 in some embodiments. Each die 154 incorporates a large number of flash memory cells 158. The cells may be arrayed in a two-dimensional (2D) or three-dimensional (3D stacked) arrangement with various control lines (e.g., source, bit, word lines) to access the cells.

Groups of cells 158 are interconnected to a common word line to accommodate pages 160, which represent the smallest unit of data that can be accessed at a time. Depending on the storage scheme, one or more pages of data may be written to the same physical row of cells, such as in the case of SLCs (single level cells with one bit per cell), MLCs (multi-level cells with two bits per cell), TLCs (three-level cells with three bits per cell), QLCs (four-level cells with four bits per cell), and so on. Generally, n bits of data can be stored to a particular memory cell 158 using $2^n$ different charge states (e.g., TLCs use eight distinct charge levels to represent three bits of data, etc.). The storage size of a page can vary; some current generation flash memory pages are arranged to store 32 KB (32,768 bytes) of user data plus associated LDPC code bits.

The memory cells 158 associated with a number of pages are integrated into an erasure block 162, which represents the smallest grouping of memory cells that can be concurrently erased in a NAND flash memory. A number of erasure blocks 162 are turn incorporated into a garbage collection unit (GCU) 164, which are logical storage units that utilize erasure blocks across different dies and which are allocated and erased as a unit.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 164 nominally uses a single erasure block 162 from each of a plurality of dies 154, such as 32 dies.

Each die 154 may further be organized as a plurality of planes 166. Examples include two planes per die as shown in FIG. 3, although other numbers of planes per die, such as four or eight planes per die can be used. Generally, a plane is a subdivision of the die 154 arranged with separate read/write/erase circuitry such that a given type of access operation (such as a write operation, etc.) can be carried out simultaneously by each of the planes to a common page address within the respective planes.

Figure 4:
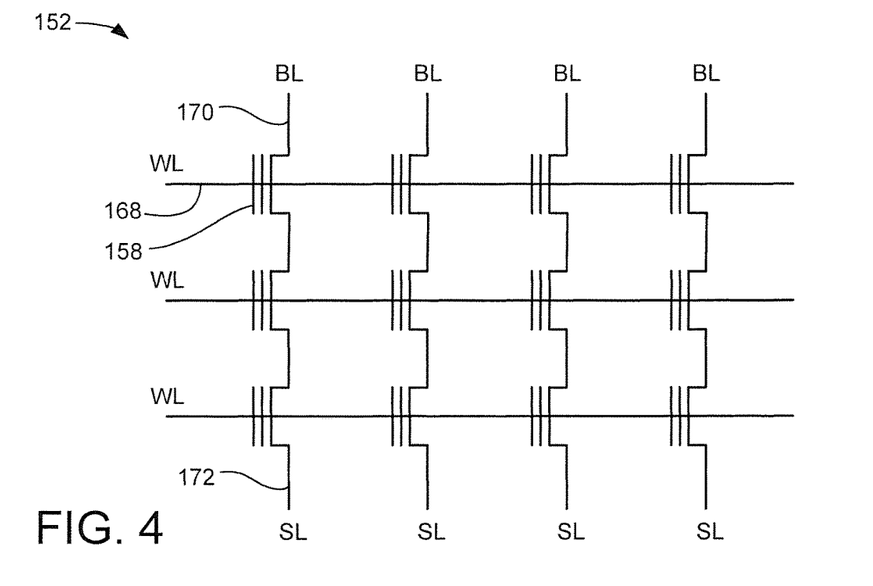
FIG. 4 provides a schematic depiction of a portion of the flash memory of FIG. 2 as operated by some embodiments.

FIG. 4 shows further aspects of the flash memory 152 in some embodiments. The memory cells 158 each take a generalized MOSFET (metal oxide semiconductor field effect transistor) configuration with a separate isolated floating gate to which programming charge may be stored. Rows of the memory cells 158 are arranged so that control gates of the cells are connected to a common word line (WL) 168. The drains and sources of the cells 158 are accessed by bit lines (BLs) 170 and source lines (SLs) 172. A number of flash die configurations can be used including two-dimensional (2D) flash, three-dimensional (3D) flash, etc.

Figure 5A:
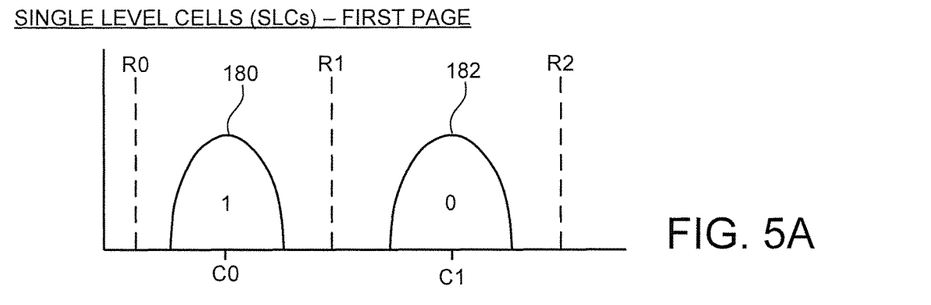
FIGS. 5A through 5D show different charge distributions for flash memory cells coupled to a common word line from FIG. 4.

FIGS. 5A through 5D show different programming configurations for the memory cells 158 along a selected word line 168. FIG. 5A configures the memory cells as single level cells (SLCs) in which a single bit of data is stored to each cell. Population 180 represents a first set of cells having a first charge state (C0) corresponding to a logical 1. Population 182 represents a different, second set of cells having a second charge state (C1) corresponding to a logical state 0. It can be seen that there will be some variation in the actual amount of charge retained by each memory cell. While these charge states are shown to be largely Gaussian, other forms can be taken.

A number of reference voltages R0, R1 and R2 are depicted as shown. These reference voltages represent control gate voltages that are supplied to the associated word line (168, FIG. 4) to sense the program state of the cells. The magnitude of R1 is sufficient to place all of the cells in the C0 charge distribution 180 (logical 1) in a forward (source-drain) conductive state, while leaving all of the cells in the C1 charge distribution 182 (logical 0) in a non-conductive state. Reference voltage R0 is insufficient to place any of the cells along the word line in a conductive state, and reference voltage R2 is sufficient to place all of the cells in a conductive state. The programmed states of the cells are sensed by determining whether the cells become conductive in response to the different applied control gate voltages. As explained below, the reference voltages may be expressed as multi-bit reference voltage inputs that are supplied to the flash module for conversion to analog control gate voltages.

Figure 5B:
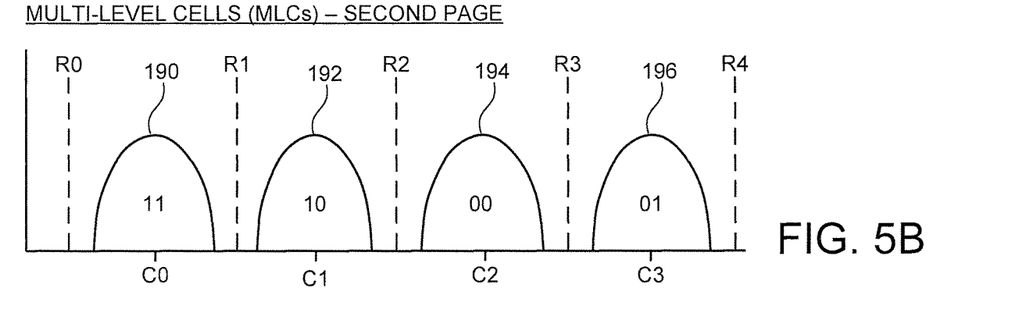

FIG. 5B shows distributions 190, 192, 194 and 196 for memory cells configured as MLCs (multi-level cells). The charge states C0, C1, C2 and C3 correspond to programmed bit sequences 11, 10, 00 and 11. It is contemplated albeit not necessarily required that the most significant bit (MSB) will correspond to the bits in a first page of data stored to the row of memory cells, and the least significant bits (LSBs) will correspond to the bits in a different, second page of data stored to the same row of memory cells. Reference voltages R0 through R4 can be used to discern the storage states of the various memory cells.

Figure 5C:
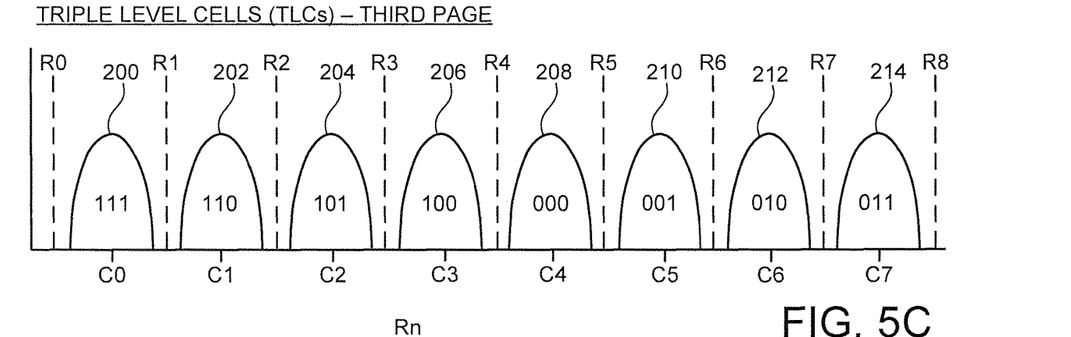

FIG. 5C shows the memory cells configured as three level cells (TLCs). In this case, eight (8) different charge states C0-C7 are used to represent three pages of data. Charge distributions 200, 202, 204, 206, 208, 210, 212 and 214 represent the memory cells along the word line with each of these distinct three-bit charge states, corresponding to three different pages of data. The MSB represents data bits from a first page, the ISB (intermediate significant bit) represents data bits from a second page, and the LSB represents data bits from a third page. Reference voltages R0-R8 can be used as required to sense the various charge states of the cells. While not shown in the drawings, it will be appreciated that QLC cells would have sixteen (16) charge states and corresponding read voltages to sense the four bits stored to each cell, and so on.

Figure 5D:
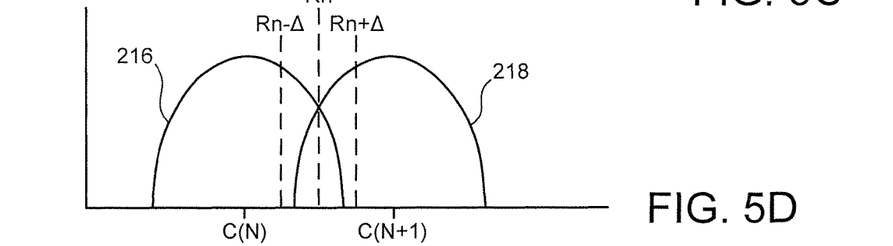

FIG. 5D represents two adjacent populations 216, 218 with charge states C(N) and C(N+1) along a given word line. These can correspond to any of the above charge distributions in FIGS. 5A-5C, or some other charge distributions. A reference voltage Rn is shown to nominally distinguish between the respective charge states. However, due to a number of factors including temperature changes, charge drift, read disturb, data aging, etc., the charge distributions may tend to overlap as shown.

In such case, different delta increments ($\Delta$) of read voltage (such as Rn-$\Delta$ and Rn+$\Delta$) can be successively applied to identify a final read voltage value that provides optimal read error performance. Remaining bit errors can thereafter be corrected using the error correction mechanisms of the device (e.g., LDPC decoder, etc.).

Figure 6:
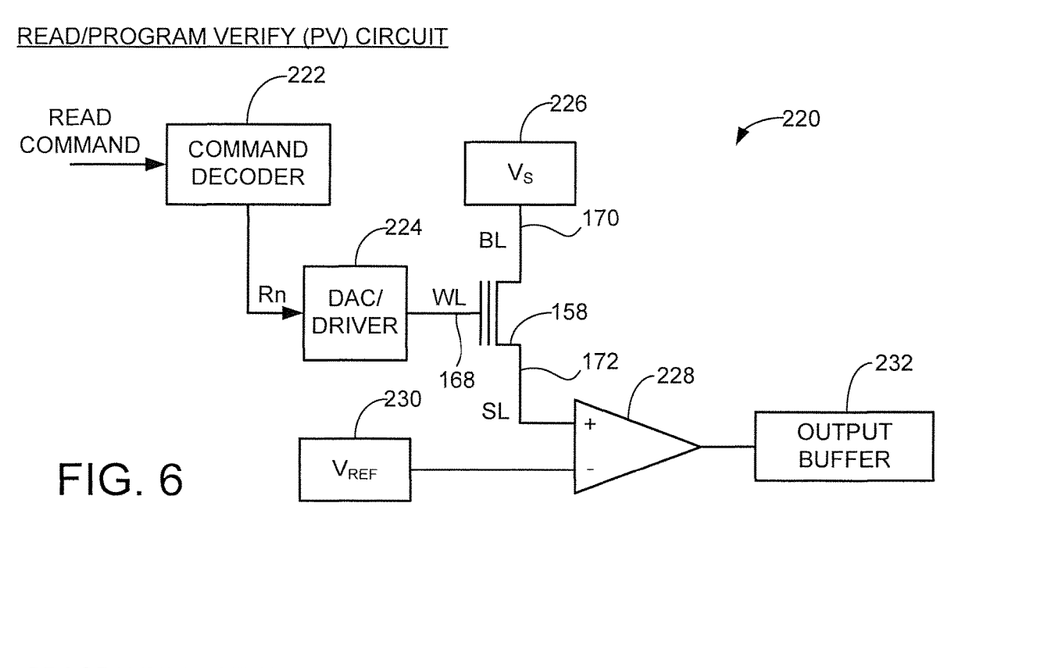
FIG. 6 shows a read/program verify circuit of the SSD of FIG. 2.

FIG. 6 shows a read/program verify circuit 220 of the SSD 110 in some embodiments. The circuit 220 is used to apply read voltages such as the various read voltages Rn from FIGS. 5A-5D to sense the programmed states of the cells. The circuit 200 includes a command decoder which receives read commands and read voltages necessary for a read operation on a selected group of memory cells 158. The decoder circuit 222 applies the multi-bit digital read voltage inputs to a digital-to-analog (DAC) driver circuit 224 to generate a corresponding analog gate voltage on the appropriate word line (WL) 168 to each memory cell 158 in turn.

A voltage source 226 applies a suitable voltage Vs to the bit line (BL) 170. The voltage on the source line (SL) 172 is provided to a comparator circuit 228 which compares this to a preselected reference voltage Vref from source 230. If the control voltage is sufficient to place the memory cell 158 in a forward (source-drain) conductive state, the output from the comparator 228 will be interpreted as a logical one (1); alternatively, the output from the comparator 228 will be a logical zero (0). The results are stored in an output buffer 232, and the bit sequence will be the sense storage state of the cell. This is repeated for all of the cells along a given word line to discern a selected page of the memory.

Figure 7:
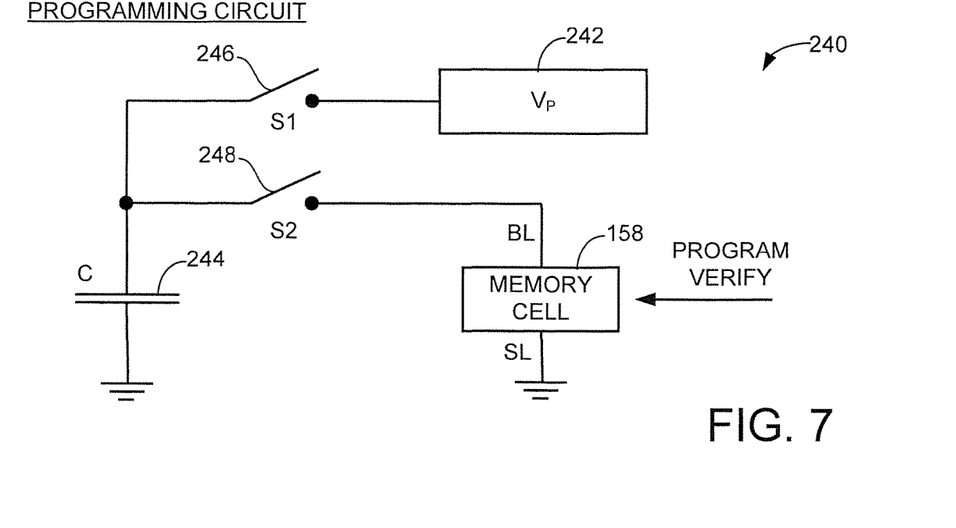
FIG. 7 shows a programming circuit of the SSD of FIG. 2.

FIG. 7 provides a corresponding programming circuit 240 used by the SSD 110 to program the various programmed states of the cells, such as those represented by FIGS. 5A-5C. A programming voltage source 242 supplies programming voltage that is intermittently stored in a storage device such as capacitor (C) 244 via selected operation of switch 246 (which may take the form of a MOSFET). The accumulated charge on capacitor 244 is periodically transferred, via switch 248 (which may also be a power MOSFET) to the memory cell. In this way, discrete quanta of charge are successively supplied to the memory cell until such time that sufficient accumulated charge is stored by the floating gate. Program verify voltages are applied to the memory cell 158 using a circuit such as the circuit 220 to determine that the appropriate amount of charge has been applied to the floating gate to achieve the desired programming state. The reference voltages used during the program verify operation may be the same as, or different from, the read voltages used during a subsequent read operation.

Figure 8:
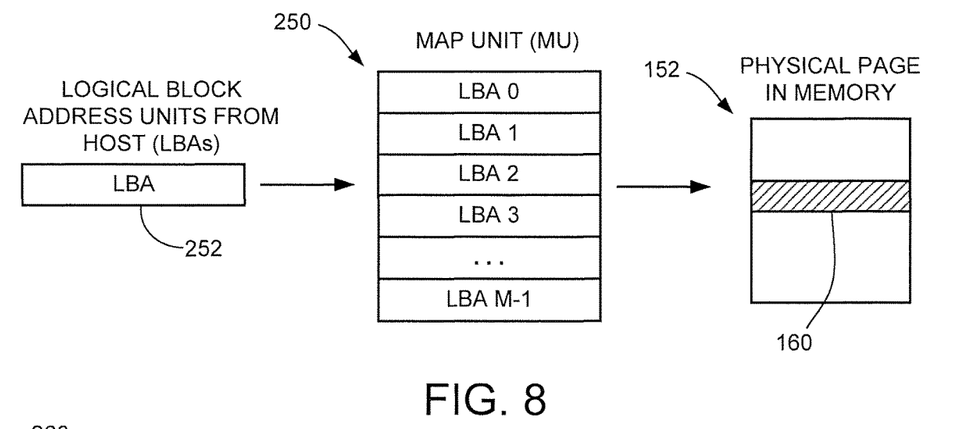
FIG. 8 shows a manner in which data may be arranged for storage by the SSD of FIG. 2 in some embodiments.

FIG. 8 represents a manner in which data may be accumulated for storage to the flash memory module 150 of the SSD in some embodiments. The user data from a host is arranged into units referred to as map units (MUs) 250. Each map unit 250 is formed from smaller host level blocks referred to as logical block addresses (LBAs) 252. The size of the blocks can vary, such as 512 bytes (B), 1024B, 4096B, etc. The map units are thereafter stored to the physical pages 160 (see FIG. 3) in the flash memory 152.

Figure 9:
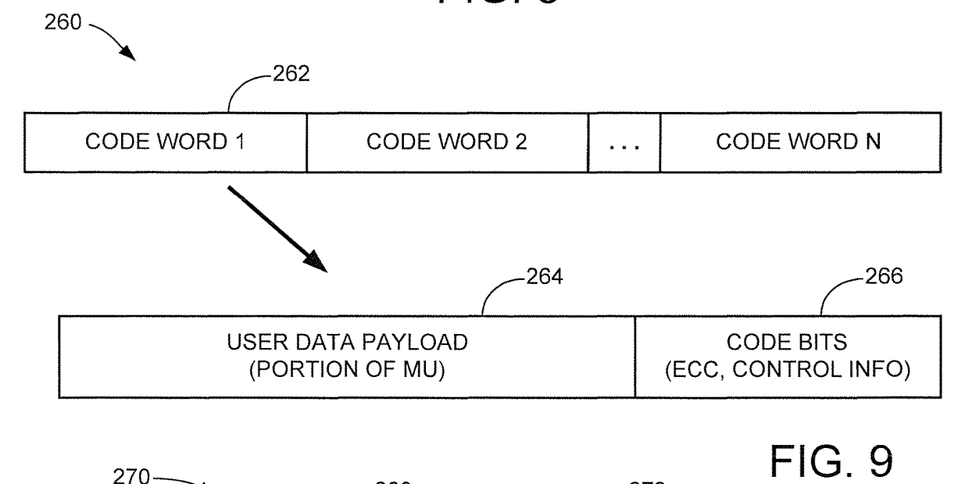
FIG. 9 shows the arrangement of the data of FIG. 8 into code words.

FIG. 9 shows a selected page 260 of data. The page 260 is made up of a plural number N code words 262. Each code word 262 is formed of a selected number of user data bits, referred to as a user data payload 264, as well as an appended number of code bits 266. The code bits represent error correction code (ECC) bits, such as but not limited to low density parity check (LDPC) bits. The code bits enable the system to detect and correct bit errors in the user data payload. In the present example, the code bits are generated by an encoder portion of the LDPC circuit 144 (FIG. 2) during a write operation and the code bits are subsequently used by a decoder portion of the LDPC circuit during a read operation.

Figure 10:
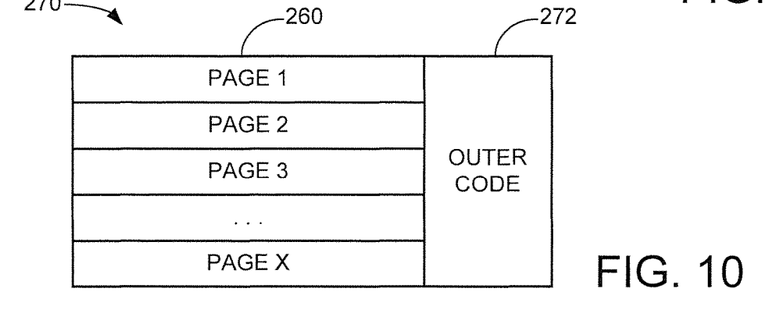
FIG. 10 shows the arrangement of the multiple pages of code words from FIG. 9 into parity sets.

FIG. 10 shows a parity set 270 representing a larger block of data stored to the flash memory 152. The parity set 270 includes a number (in this case X) of pages worth of data (code words 262) plus an outer code parity value 272 that protects the entire parity set. In some embodiments, each parity set 270 comprises a total of 32 pages of data written to a separate erasure block in each of 32 dies, with 31 pages of user data code words and one (1) page of parity data. In this way, the data can still be recovered even with the failure of one of the dies. Other ratios and arrangements can be used.

Figure 11:
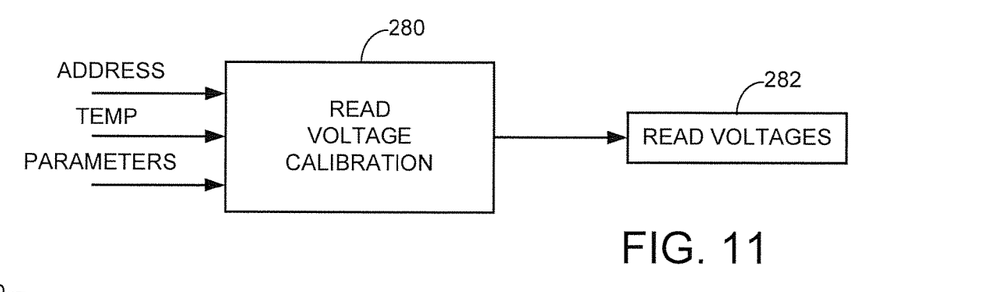
FIG. 11 is a functional block representation of a read voltage calibration circuit constructed and operated in accordance with some embodiments.

FIG. 11 shows a read voltage calibration circuit 280 that can be used to select appropriate read voltages (such as the various read voltages Rn shown in FIGS. 5A-5D) to sense the programmed states of the memory cells in the SSD 110. The circuit 280 can be realized as one or more programmable processors using associated programming in the form of firmware (FW), such as one or more the programmable processors of the controllers 112, 114 and/or 116 in FIG. 2. In other embodiments, the circuit 280 may be a non-processor based hardware circuit configured to carry out the specified functions.

The circuit 280 operates at appropriate times to select a new set of read voltages for every page 160, 260 in the SSD 110. These read voltages are stored in an appropriate data structure in memory 282 for recall and use as required.

Figure 12:
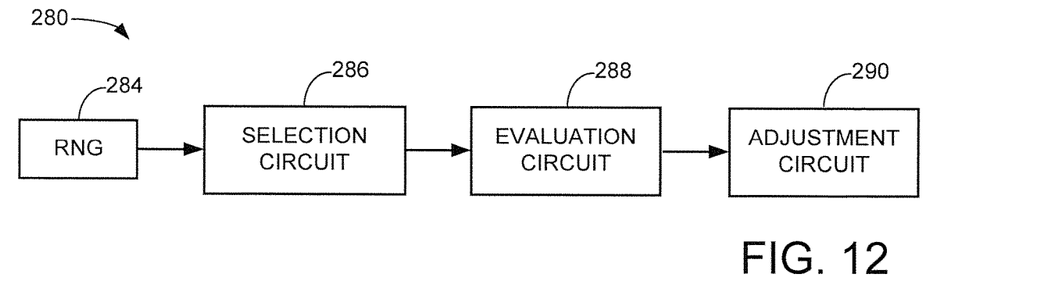
FIG. 12 shows the read voltage calibration circuit of FIG. 11 in some embodiments.

FIG. 12 shows the circuit 280 in some embodiments. The circuit 280 includes a random number generator (RNG) 284, a code word selection circuit 286, an evaluation circuit 288 and an adjustment circuit 290. The RNG 284 can take a variety of forms including a circuit that receives random numbers from an external source, a ring oscillator, a low entropy source that generates low entropy that is then conditioned to provide random numbers, etc. It is contemplated that the random numbers may be pseudo-random or true random numbers, depending on the configuration of the system. In some cases, random numbers can be stored in a local memory and recalled and used as required.

The selection circuit 286 uses the random numbers from the RNG 284 to randomly select a code word (CW) 262 from each page in the flash memory 152 for evaluation. Once selected, the evaluation circuit applies different read voltages with suitable increments (both plus and minus) and the code words are repetitively retrieved and evaluated using the different read voltages. An error rate metric is selected to adjudge the effectiveness of each set of read voltages. One error rate metric may be an overall bit error rate (BER), as a ratio of erroneous bits in relation to total bits read. Another error rate metric may be the number of unresolvable errors (syndromes) from the LDPC decoder. Substantially any type of error rate metric can be used. Increments may be added or subtracted from the various read voltage levels as illustrated in FIG. 5D.

After multiple passes reading the selected code word and obtaining associated error rate metrics, the adjustment circuit 290 evaluates the results and selects an optimum set of read voltages for each page. In some cases, parametric factors such as PE counts, read disturb (number of previous reads to a given erasure block), data aging (time since the most recent programming cycle), and temperature may be taken into account in determining the final set of read voltages.

Figure 13:
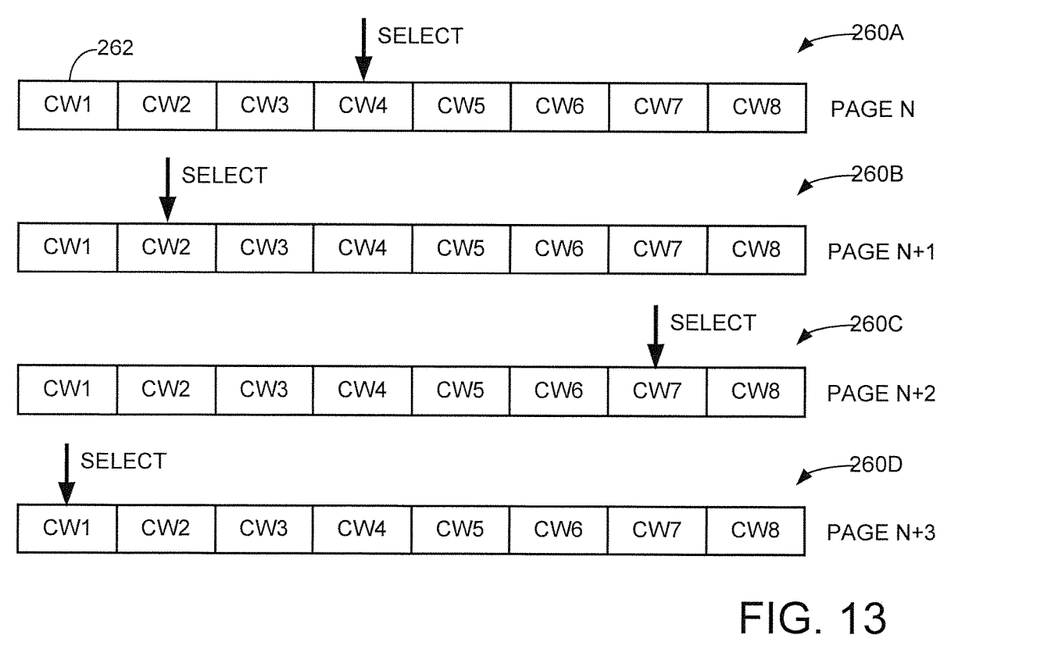
FIG. 13 shows the selection of different code words from different pages of data stored to a common set of flash memory cells coupled to a common word line.

FIG. 13 shows four pages of data 260A through 260D stored to the flash memory cells 158 along a selected word line 168. The cells are arranged as QLCs so that the four pages of data are expressed as different bits of a four-bit value in each cell. The pages are arbitrarily labeled as Pages N through N+3. Each page stores a total of eight (8) code words 262 (CW1 through CW 8).

The selection circuit 286 of FIG. 12 randomly selects a different code word from each page; as shown in FIG. 13, CW4 is selected from Page N; CW2 is selected from Page N+1; CW7 is selected from Page N+2; and CW1 is selected from Page N+3. It will be noted that the code word selections are non-overlapping, so that approximately 50% of the cells along the word line will be evaluated.

The evaluation circuit 288 of FIG. 12 repetitively reads the associated code word from each page in turn, submits such for LDPC decoding, and evaluates the results. To this end, the read voltages are supplied by the evaluation circuit 288 to the flash module 150 which returns the requested bit sequences. The adjustment circuit 290 adds and subtracts appropriate increments to the base values. It will be appreciated that the evaluation of Page N will be for SLC read voltage levels (e.g., R0-R2, FIG. 5A), Page N+1 will evaluate MLC read voltage levels (e.g., R0-R4, FIG. 5B), Page N+2 will evaluate TLC read voltage levels (e.g., R0-R7, FIG. 5C) and Page N+3 will evaluate QLC read voltage levels (e.g., R0-R15). Different read voltage sets will be separately obtained for each page. For example, the intermediate read voltage R1 for Page N may be of different magnitude than the intermediate read voltage R4 for Page N+2, and so on.

Figure 14:
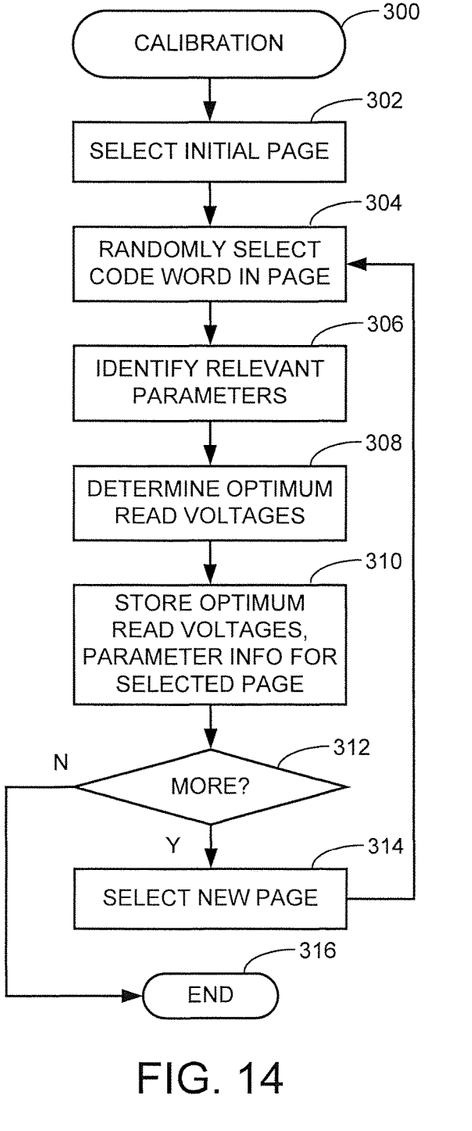
FIG. 14 is a calibration routine illustrative of steps carried out by the read voltage calibration circuit in accordance with some embodiments.

FIG. 14 provides a calibration routine 300 to set forth steps that may be carried out by the calibration circuit 280 in some embodiments. As noted above, the calibration routine can be carried out at suitable times, such as a periodic background process as well as at suitable times such as when large temperature excursions are detected, etc.

An initial page for evaluation is first selected at step 302, such as page N in FIG. 13. A particular code word from the selected page is next identified at step 304 (such as CW4 in FIG. 13). The code word may be selected in response to a random number, although other random mechanisms can be used such as by incrementing the code word location for each page by some integer number of code words. Relevant parameters associated with the selected page and code word are next identified at step 306.

Optimum read voltages for the selected page/code word combination are next determined at step 308 using the sequence described above. In some cases, an acceptable level of error rate performance may be determined using a predetermined threshold. Error rate performance can be adjudged in a number of ways including syndrome weights from the LDPC decoder, bit error rates (BER), numbers of LDPC iterations to arrive at a successful output value, and so on. The parameters may be used in the selection of the appropriate read voltages, such as excessive PE counts, data aging, etc. The optimum read voltages and other parametric information are thereafter stored in a suitable memory location for the selected page, step 310.

Decision step 312 determines whether there are additional pages in the memory that require evaluation; if so, a new page is selected at step 314 and the foregoing sequence is repeated until such time that all pages have been evaluated, after which the routine ends at step 316.

Figure 15:
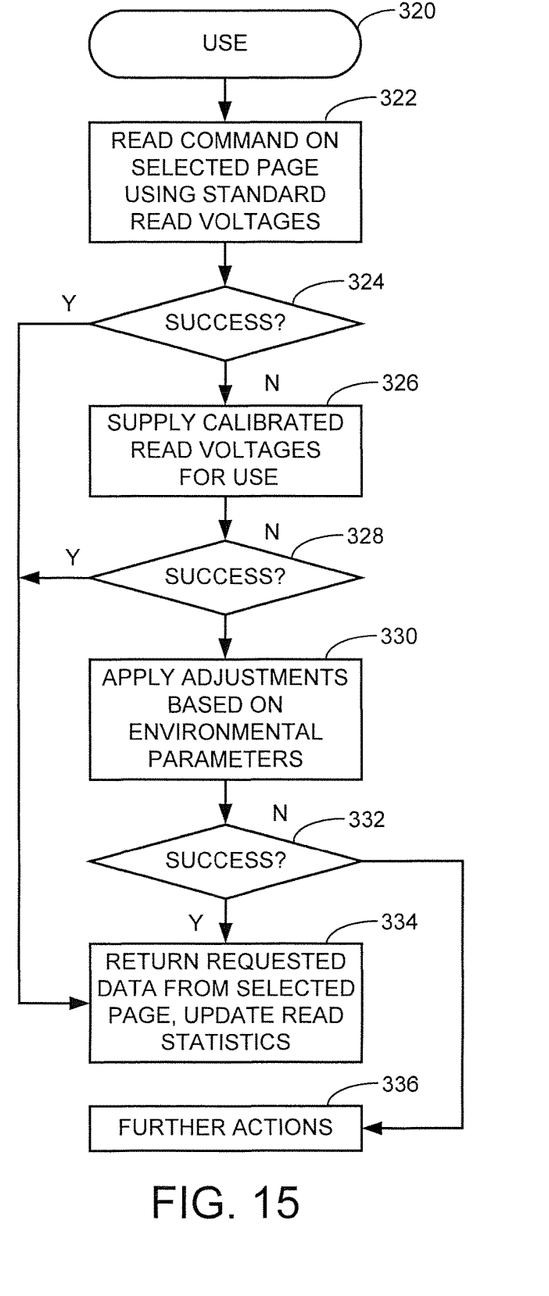
FIG. 15 is a use routine illustrative of steps carried out by the SSD using the calibrated read voltages obtained from FIG. 14 in some embodiments.

FIG. 15 shows a use routine 320 that illustrates a manner in which the optimized read voltages obtained from the calibration routine 300 of FIG. 14 can be used. It will be appreciated that in some applications, the controller circuit 112 supplies all read voltages used by the flash module 150. In other applications, the controller may initially request the data and the flash module may apply one or more sets of default internal voltages in an effort to return the requested data, and the controller only supplies the read voltages at such time that these initial attempts to successfully return the data are unsuccessful. It will be appreciated that the routine of FIG. 15 is generalized and that other steps may be incorporated into the read recovery flow.

The process begins at step 322 where a read command is issued to return data from a selected page in the system. In the embodiment of FIG. 15, this is carried out using a first, standard set of read voltages. Decision step 324 determines whether the read operation was successful. If not, calibrated read voltages obtained from FIG. 14 are supplied to the flash module at step 326. Decision step 328 determines whether this read retry operation with the calibrated read values were successful.

If not, additional adjustments can be made to the calibrated read voltages based on environmental parameters; for example, a large cross-temperature differential (CTD) value between the temperature when the data were programmed and the temperature now when the data are being read may result in the application of one or more increments to the calibrated read voltages for that page.

Decision step 332 determines whether the calibrated and adjusted read voltages were successful in recovering the data. If so, the data are returned and processed in service of the read command. As required, read statistics and other parameters may be updated at this time.

If the foregoing steps did not result in successful recovery of the data, further actions may be taken at step 336. This may include the recovery and use of the outer code data for the parity set shown in FIG. 10. Other steps may be taken as well, including relocating the data using a garbage collection operation, etc.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   a non-volatile memory (NVM) comprising flash memory cells arranged along word lines to which read voltages are applied to sense programmed states of the memory cells, the flash memory cells along each word line configured to concurrently store multiple pages of data;
   an encoder circuit configured to apply error correction encoding to input data to form code words comprising user data bits and code bits, an integral number of the code words written to each page, the encoder circuit writing at least a first page and a second page to a selected word line; and
   a reference voltage calibration circuit configured to randomly select a single selected code word from the first page of the selected word line and a different, single selected code word from the second page of the selected word line and to use the code bits from the single selected code words of the first and second pages to generate a set of calibrated read voltages for each of the first and second pages, the first and second selected code words written to different, non-overlapping flash memory cells along the selected word line.

2. The apparatus of claim 1, further comprising a random number generator circuit configured to generate a sequence of random numbers, wherein the reference voltage calibration circuit uses the sequence of random numbers to select the first and second code words from the first and second pages of the selected word line.

3. The apparatus of claim 1, further comprising a decoder circuit configured to apply error correction decoding to a bit sequence obtained from each of the first and second code words, the code bits used by the decoder circuit to correct bit errors in the bit sequence to return the user data bits from each of the first and second code words.

4. The apparatus of claim 3, wherein the encoder circuit is a low density parity check (LDPC) encoder, the decoder circuit is an LDPC decoder, and the code bits are LDPC code bits.

5. The apparatus of claim 1, wherein the set of calibrated read voltages for the associated first and second pages provide an acceptable level of error rate performance that falls within a predetermined error rate threshold.

6. The apparatus of claim 1, wherein a third page and a fourth page are additionally written to the flash memory cells coupled to the selected word line so that the flash memory cells are characterized as QLCs each storing four bits of data using sixteen charge levels, wherein a third selected code word is selected from the third page and a fourth selected code word is selected from the fourth page, and wherein each of the first, second, third and fourth code words are written to a different, non-overlapping grouping of the flash memory cells along the selected word line.

7. The apparatus of claim 6, wherein a total of eight code words are written to each of the first, second, third and fourth pages of the selected word line, and wherein approximately 50% of the flash memory cells along the selected word line are evaluated by the reference voltage calibration circuit.

8. The apparatus of claim 1, wherein the non-volatile memory (NVM) comprises a plurality of semiconductor dies on which the flash memory cells are arranged as erasure blocks, each erasure block representing a smallest grouping of the memory cells that can be erased at a time, each erasure block further comprising a plurality of word lines which connect to a corresponding number of the flash memory cells.

9. The apparatus of claim 1, characterized as a solid-state drive (SSD), the NVM characterized as a three-dimensional (3D) NAND flash memory.

10. A solid-state drive (SSD), comprising:
    a flash memory module comprising flash memory cells arranged on a plurality of semiconductor dies, each die comprising a plurality of erasure blocks, each erasure block having a plurality of word lines to which sets of the flash memory cells are coupled to receive control gate voltages to sense programmed states of the flash memory cells;
    a random number generator configured to generate random numbers;
    a low density parity check (LDPC) encoder circuit configured to apply LDPC encoding to sets of input data to generate code words comprising user data bits and code bits;
    a write circuit configured to write an integral number of the code words to each of a number of pages to the sets of the flash memory cells coupled to each of the word lines, the memory cells coupled to a selected word line having at least a first page and a second page written thereto;
    an LDPC decoder circuit configured to subsequently apply LDPC decoding to a bit sequence obtained from the code words from the number of pages during a read operation, the code bits of each code word used by the LDPC decoder circuit to correct bit errors in the user bits of each code word; and
    a reference voltage calibration circuit configured to select sets of read voltage levels to be applied to each page in the NVM to generate the bit sequences by randomly selecting, in turn, a single selected code word from each page responsive to the random numbers from the random number generator, the random numbers being used to select a first code word from the first page and a second code word from the second page of the selected word line, the first code word written to a first grouping of the memory cells along the selected memory line, the second code word written to a different, non-overlapping grouping of the memory cells along the selected memory line.

11. The SSD of claim 10, wherein the sets of read voltage levels selected by the reference voltage calibration circuit enable the LDPC decoder circuit to successfully resolve all bit errors in the associated bit sequences.

12. The SSD of claim 10, wherein the reference voltage calibration circuit further determines the sets of read voltage levels responsive to at least a selected one of the following parameters: a program/erase (PE) count, a data aging value, a read count, or a temperature of the NVM.

13. The SSD of claim 10, wherein a third page and a fourth page are additionally written to the flash memory cells coupled to the selected word line so that the flash memory cells are characterized as QLCs each storing four bits of data using sixteen charge levels, wherein a third selected code word is selected from the third page and a fourth selected code word is selected from the fourth page, wherein each of the first, second, third and fourth code words are written to a different, non-overlapping grouping of the flash memory cells along the selected word line, wherein the reference voltage calibration circuit further generates a third set of read voltages for the third page and an independent, fourth set of read voltages for the fourth page, the third and fourth sets of read voltages subsequently applied respectively to the selected word line to read the code words written to the respective third and fourth pages.

14. The SSD of claim 13, wherein the first set of read voltages detect SLC (single level cell) program states, the second set of read of voltages detect MLC (multi-level cell) program states, the third set of read voltages detect TLC (third-level cell) program states, and the fourth set of read voltages detect the QLC (quad-level cell) program states.

15. A method comprising:
storing data to each of a plurality of pages in a non-volatile memory (NVM), each page representing data stored to a row of flash memory cells coupled to a common word line, the data arranged as an integer number of code words in each page, each code word comprising a plurality of user data bits and a plurality of error correction code (ECC) bits;
randomly selecting a single selected code word from each page coupled to a corresponding word line, each selected code word having a different, non-overlapping number of memory cells along the associated word line; and
generating, for each selected page, a calibrated set of read voltages in response to bit errors obtained during repetitive reading of the single selected code word from the selected page; and
subsequently using the calibrated set of read voltages for each selected page to read the code words written to the selected page.

16. The method of claim 15, further comprising generating a random number and using the generated random number to select a different code word from each selected page, wherein different code words are selected from each of a set of multiple pages stored to the flash memory cells on a selected word line.

17. The method of claim 15, further comprising using a decoder circuit during the generating step to use the ECC bits to correct bit errors in the single selected code word repetitively read from the selected page.

18. The method of claim 15, further comprising adjusting the calibrated set of read voltages for each selected page by an adjustment interval selected responsive to at least a selected one of the following parameters: a program/erase (PE) count, a data aging value, a read count, or a temperature of the NVM.

19. The method of claim 15, wherein a selected word line has at least a first page and a second page written to the memory cells coupled thereto, wherein a first code word of the first page is written to a first set of the memory cells coupled to the selected word line, wherein a second code word of the second page is written to a non-overlapping second set of the memory cells coupled to the selected word line, and wherein respective first and second calibrated sets of read voltages are obtained for each of the first and second code words of the respective first and second pages.

20. The method of claim 15, wherein the randomly selecting and generating steps are repeated over a plurality of successive intervals, and wherein different ones of the code words are selected during each of the plurality of successive intervals.

* * * * *